(12) United States Patent
Kireev et al.

(10) Patent No.: US 10,593,762 B2
(45) Date of Patent: Mar. 17, 2020

(54) METHOD FOR TRANSFERRING GRAPHENE PIECES ONTO A SUBSTRATE

(71) Applicant: Forschungszentrum Juelich GmbH, Juelich (DE)

(72) Inventors: Dmitry Kireev, Juelich (DE); Dario Sarik, Aachen (DE); Bernhard Wolfrum, Unterschleissheim (DE); Andreas Offenhausser, Aachen (DE)

(73) Assignee: Forschungszentrum Juelich GmbH (DE)

( * ) Notice: Subject to any disclaimer, the term of this patent is extended or adjusted under 35 U.S.C. 154(b) by 0 days.

(21) Appl. No.: 15/771,423

(22) PCT Filed: Nov. 16, 2016

(86) PCT No.: PCT/DE2016/000400
§ 371 (c)(1),
(2) Date: Apr. 27, 2018

(87) PCT Pub. No.: WO2017/097279
PCT Pub. Date: Jun. 15, 2017

(65) Prior Publication Data
US 2018/0342586 A1   Nov. 29, 2018

(30) Foreign Application Priority Data
Dec. 12, 2015 (DE) .......... 10 2015 016 143

(51) Int. Cl.
*H01L 29/16* (2006.01)
*C01B 32/194* (2017.01)
(Continued)

(52) U.S. Cl.
CPC .......... *H01L 29/1606* (2013.01); *B32B 3/14* (2013.01); *B32B 9/007* (2013.01); *B32B 37/18* (2013.01);
(Continued)

(58) Field of Classification Search
CPC .......... H01L 29/1606; H01L 29/66015; C01B 32/194; B32B 3/14; B32B 9/007; B32B 37/18
See application file for complete search history.

(56) References Cited

U.S. PATENT DOCUMENTS

2017/0028692 A1 * 2/2017 Kim ............... B32B 37/025

FOREIGN PATENT DOCUMENTS

EP    2937313 A1   10/2015
WO   2015075292 A1    5/2015

OTHER PUBLICATIONS

Jan-Kai Chang et al: "Graphene Anodes and Cathodes: Tuning the Work Function of Graphene by Nearly 2 eV with an Aqueous Intercalation Process", ACS Applied Materials and Interfaces, vol. 7, No. 31, Aug. 12, 2015 (Aug. 12, 2015), US, pp. 17155-17161, XP055339860, ISSN: 1944-8244, DOI: 10.1021/acsami.5b03934.
(Continued)

*Primary Examiner* — Tucker J Wright
*Assistant Examiner* — Scott Stowe
(74) *Attorney, Agent, or Firm* — Jordan and Koda, PLLC

(57) ABSTRACT

Transferring graphene pieces onto a substrate, by the following steps: a) selecting a substrate comprising a plurality of placeholders for the graphene pieces; b) disposing and aligning the substrate on a substrate holder in a chamber; c) selecting a transfer layer having openings as placeholders for the graphene pieces; d) disposing and aligning the transfer layer on the substrate holder over the substrate so that the openings of the transfer layer are aligned over the placeholders on the substrate; e) adding liquid to the chamber to above the transfer layer, and raising the transfer layer on the liquid column; f) introducing graphene pieces onto the liquid film in the openings of the transfer layer; and g) reducing the distance between the substrate and the graphene pieces until the graphene pieces are disposed on the placeholders of the substrate. A substrate and a device for carrying out the method.

8 Claims, 8 Drawing Sheets

(51) Int. Cl.
*B32B 3/14* (2006.01)
*B32B 9/00* (2006.01)
*B32B 37/18* (2006.01)
*H01L 29/778* (2006.01)

(52) U.S. Cl.
CPC ........ *C01B 32/194* (2017.08); *B32B 2313/04* (2013.01); *B32B 2457/00* (2013.01); *H01L 29/778* (2013.01)

(56) References Cited

OTHER PUBLICATIONS

Liang, X.; Sperling,-B. A; Caiizo, I.; Cheng, G.; Hacker, C. A.; Zhang, Q.; Richter, C. A.: "Toward clean and crackless transfer of graphene", ACS NANO, vol. 5, No. 11, 2011, pp. 9144-53, XP055117159, DOI: doi:10.1021/nn203377t.

Mattevi, C.; Kim, H.; Chhowalla, M: "A review of chemical vapour deposition of graphene on copper", Journal of Materials Chemistry, vol. 21, No. 10, 2011, pp. 3324, XP055128831, DOI: doi:10.1039/C0JM02126A.

Suk J W et al: "Transfer of CVD-Grown Monolayer Graphene onto Arbitrary Substrates", ACS NANO, American Chemical Society, US, vol. 5, No. 9, Sep. 27, 2011 (Sep. 27, 2011), pp. 6916-6924, XP002720932, ISSN: 1936-0851, [retrieved on Sep. 6, 2011], DOI: 10.1021/NN201207C.

Wei-Hsiang Lin et al: "A Direct and Polymer-Free Method for Transferring Graphene Grown by Chemical Vapor Deposition to Any Substrate", ACS NANO, vol. 8, No. 2, Feb. 25, 2014 (Feb. 25, 2014), US, pp. 1784-1791, XP055339735, ISSN: 1936-0851, DOI: 10.1021/nn406170d.

Xiang Zhang et al: "Graphene's potential in materials science and engineering", RSC Advances: An International Journal to Further the Chemical Sciences, vol. 4, No. 55, May 23, 2014 (May 23, 2014), GB, pp. 28987, XP055339915, ISSN: 2046-2069, DOI: 10.1039/C4RA02817A.

\* cited by examiner

20

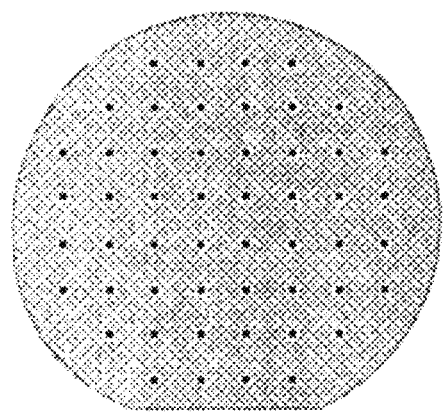
FIG. 6a
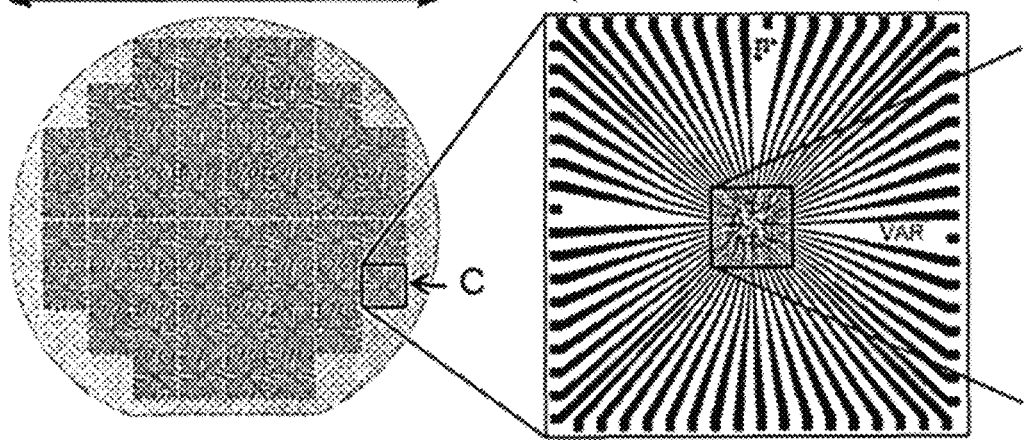
FIG. 6b  FIG. 6c
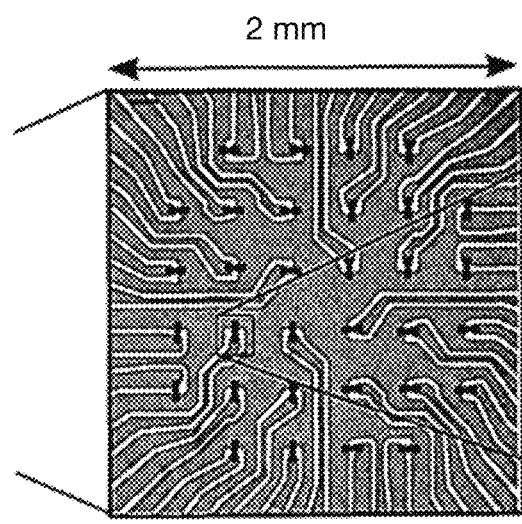  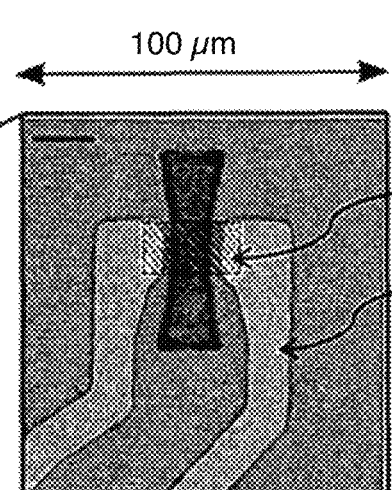
FIG. 6d  FIG. 6e

METHOD FOR TRANSFERRING GRAPHENE PIECES ONTO A SUBSTRATE

The invention relates to a method for transferring graphene pieces onto a substrate.

BACKGROUND OF THE INVENTION

A method for transferring graphene grown on CVD onto substrates is known from Suk et al. The method is referred to as a wet transfer and is used widely (Suk, J. W., Kitt, A., Magnuson, C. W., Hao, Y., Ahmed, S., An, J., . . . Ruoff, R. S. (2011). Transfer of CVD-grown monolayer graphene onto arbitrary substrates. ACS Nano, 5(9), 6916-24.). The wet transfer comprises the following steps (FIG. 1—prior art):
a) First, graphene 2 is grown on a copper foil 3 by way of the CVD method [Mattevi, C, Kim, H., & Chhowalla, M. (2011), A review of chemical vapour deposition of graphene on copper, Journal of Materials Chemistry, 21(10), 3324.]
b) The graphene 2 on the copper foil 3 is thereafter spin-coated with a 200 to 500 nm thick PMMA film 1. (FIG. 1a).
c) The film is placed in a copper etching solution 4 with the copper 3 first (FIG. 1b) and is retained there until it is ensured that the copper has completely dissolved. Thereafter, the etching solution is replaced with deionized water 5 so as to clean the PMMA/graphene film 1, 2.
d) The target substrate 6 is used as a "fishing" tool to collect the PMMA/graphene film 1, 2 from the water surface 5 (FIG. 1c).
e) The substrate 6 is dried, and the PMMA is removed by way of solvent (FIG. 1d). The graphene 2 remains on the target substrate 6 (no reference numeral shown).

Layers having the same hatching in FIGS. 1a to d correspond to one another.

The "fishing transfer" is easy to carry out for substrates extending up to 1 inch. Problems, however, occur at dimensions of 4 to 8 inches. The disadvantage is that the "wet transfer" becomes increasingly difficult to carry out with larger graphene pieces, and too many defects arise due to creases and cracks in the transferred structures on the substrate. Even if a large piece of graphene having a dimension, in inches, of n inches, such as n>2, is successfully transferred onto an n-inch substrate or wafer, the majority of the graphene is generally etched away again after the transfer, which is an uneconomical waste of material.

It is also not possible to transfer more than 2 pieces of graphene with precision onto a desired location on the target substrate, while ensuring an exact distance between the pieces, using the conventional "wet transfer" method. Ultimately, the small graphene pieces move away from the desired location again during drying and fishing, due to the surface tension of the water.

SUMMARY OF THE INVENTION

It is the object of the invention to provide a fast, simple and economical method for transferring graphene pieces onto large substrates for further fabrication, which does not exhibit the advantages from the prior art. It is furthermore an object of the invention to provide a substrate having a plurality of graphene pieces positioned thereon and to show further uses of such substrates. It is a further object of the invention to provide a device for carrying out the method.

The object is achieved by the method according to claim 1, and by the device for carrying out the method and the substrate, produced by way of the method, according to the dependent claims. Advantageous embodiments in this regard will be apparent from the respective claims dependent thereon.

The method for transferring graphene pieces onto a substrate is characterized by the following steps:
a) selecting a substrate, which, in particular, is suitable for the semiconductor industry, comprising a plurality of placeholders for the graphene pieces;
b) disposing and aligning the substrate on a substrate holder in a chamber;
c) selecting a transfer layer having openings as placeholders for the graphene pieces;
d) disposing and aligning the transfer layer on the substrate holder over the substrate so that the openings in the transfer layer are aligned over the placeholders on the substrate. Preferably, in doing so the transfer layer is fixed in the X-Y plane;
e) adding a liquid to the chamber to above the transfer layer, and raising the transfer layer on the liquid column;
f) introducing graphene pieces onto the liquid film in the openings of the transfer layer; and
g) reducing the distance between the substrate and the graphene pieces until the graphene pieces are disposed on the placeholders of the substrate.

For this purpose, the liquid may be removed from the chamber, so that the transfer layer is lowered on the liquid column, and the graphene pieces in the openings of the transfer layer are transferred onto the placeholders of the substrate.

Alternatively, in step g), it is also possible to move the substrate to the floating graphene flakes by way of a slow lifting mechanism. For this purpose, the transfer film should be fixed in the Z-plane, and a lifting mechanism for the substrate should be disposed in the chamber.

This advantageously allows the method to include a relative movement so as to reduce the distance between the surface of the substrate and the surface of the liquid.

As a result of the invention, graphene is transferred with precision to the desired locations of the substrate, these being the placeholders. This is achieved by providing the substrate with a pattern so as to define the desired regions in which graphene is to be positioned. The desired locations or regions on the substrate are also referred to hereafter as placeholders.

According to the invention, the graphene is thus only transferred onto these small regions, these being the placeholders on the substrate, instead of onto the entire substrate. This pattern can be flexibly selected according to the respective application purpose for the substrate.

The method, advantageously, allows a semi-automatic transfer of graphene pieces onto the desired locations on a wafer. Compared to conventional graphene transfer methods, the yield of the method is up to 2500% higher.

The solution according to the invention transfers graphene pieces precisely onto the desired regions. $N\_g$ shall be the number of the desired regions on the target substrate having the specific area extension A. The solution to the problem according to the invention minimizes the amount of wasted material, and moreover simplifies and expedites the process for large-scale transfer operations.

The method according to the invention thus represents an intermediate step to the high-volume production of graphene-based components on an industrial scale.

In detail, the method provides for the following steps.
Step a):

In the first step, the substrate comprising placeholders is selected. This determines the fabrication procedure and the substrate for a desired component or desired components. This determines how much graphene in total is necessary for the substrate, as well as the number of graphene pieces. $N\_g$ represents the number of desired locations in which the graphene is to be disposed, which is found by the placeholders on the substrate. A denotes the surface area covered by an individual graphene piece. In general, the entire surface area covered by the graphene on the substrate is defined by $A*N\_g$ and, within the meaning of the invention, is generally and advantageously less than 10%, preferably less than 9%, 8%, 7%, 6% or even less than 5% of the total surface area of the substrate.

Any arbitrary substrate, and in particular substrates from the semiconductor technology, may be selected for this purpose, which is to say, in particular silicon wafers. The placeholders on the wafer can be defined by chips in a first approximation, on which the graphene pieces are to be positioned. The actual placeholders are disposed in the chips. Advantageously, the surface area of a placeholder corresponds approximately to the surface area of a graphene piece to be transferred.

Step b):

In the second step, the substrate is disposed and aligned on a substrate holder in a chamber.

The chamber is a device for carrying out the method.

For this purpose, the device according to the invention for carrying out the method comprises at least one main chamber, preferably including a vacuum suction device in the substrate holder for the substrate, a number $N\_c$ of fixing pins or alignment columns, where N=number and c=columns. The chamber, advantageously, also comprises a feed and/or a discharge for a liquid.

The term fixing pin is used hereafter synonymously with alignment column.

The chamber comprises a substrate holder, having a surface area that is dependent on the dimensions of the substrate and suitable for positioning the substrate on the substrate holder. The substrate holder is disposed in the bottom of the chamber and, preferably, equipped with a device for applying the vacuum. The substrate is disposed and aligned on the substrate holder with the placeholders facing up.

The substrate holder forms part of the chamber and is thus located on the inside of the chamber. The substrate holder is disposed on a base plate of the chamber, for example screwed thereto. The substrate holder, and if necessary, further provided means, fix the substrate at the intended location.

The substrate is aligned on the substrate holder such that sliding of the substrate on the holder is precluded while the method is being carried out. For this purpose, a vacuum holder can be used as the substrate holder. After the substrate has been positioned and aligned on the holder, the substrate is advantageously fixed on the substrate holder by way of a vacuum.

In an advantageous embodiment of the invention, the device, for this purpose, comprises further means for aligning and fixing the substrate and/or further layers, such as the transfer layer, on the substrate.

In particular, at least one fixing pin, serving as the means, can be anchored perpendicularly in the bottom of the chamber or on the edge of the substrate holder, the fixing pin delimiting the substrate. Multiple fixing pins can be disposed on or around the edge of the substrate holder in the bottom of the chamber. The fixing pin is, or the fixing pins are, aligned perpendicularly in the chamber and disposed as alignment markers, by way of which the substrate and/or in particular further layers, such as a transfer layer, are fixed in the X-Y direction, so that a rotation of the transfer layer is precluded.

The fixing pin or fixing pins can also be disposed at a certain distance around the substrate and surround the same.

The fixing pin or fixing pins can be anchored in the base plate of the chamber, for example screwed thereto.

The fixing pin or fixing pins can also be anchored on the edge of the substrate holder, for example screwed thereto.

The dimensions of the chamber, the distance of the fixing pins with respect to one another and with respect to the substrate or the substrate holder, and so forth, depend on the dimensions of the substrate itself and the diameter of the substrate holder.

In particular, a plurality of, for example, 3, 4, 5 or in particular 6 or more, fixing pins can be disposed in the chamber, which delimit the substrate or a transfer layer at the outside edges thereof and/or prevent the substrate or a transfer layer from sliding on the substrate holder.

For this purpose, a plurality of fixing pins are disposed along the outer edge of the substrate and, in particular, in the base plate of the chamber. The fixing pin prevents, or the fixing pins prevent, the substrate or a transfer layer from breaking out of the position provided on the holder in the X-Y plane.

In a further particularly advantageous embodiment of the invention, the fixing pin serves, or the fixing pins serve, as a means to prevent the rotation of the substrate and of further layers disposed on the substrate, such as, in particular, of the transfer layer, by way of which the graphene pieces are to be disposed on the placeholders of the substrate.

The means prevent the rotation, in particular of this transfer layer, about the center thereof when the method is being carried out. The transfer layer is fixed in the X-Y plane thereof by the means, such as the fixing pins. At the same time, the transfer layer itself can be moved in the Z-plane. The substrate remains fixed on the substrate holder.

In this way, the means advantageously cause the openings in the transfer layer for accommodating the graphene to remain disposed exactly over the placeholders in the substrate, while the method is being carried out.

The substrate fixed on the holder is thus prepared for the transfer of the graphene pieces.

Step c):

The transfer layer, which is important for the method, is selected and/or produced. The transfer layer is produced by transferring the pattern, which is to say the position, the number and the size of the placeholders of the substrate, true to scale, onto the transfer layer, and creating openings in the transfer layer corresponding to this pattern. These openings are used thereafter to introduce the graphene pieces therein and apply these onto the placeholders of the substrate.

The transfer layer thus, preferably, includes openings having a position, size and number corresponding to the position, number and size of the placeholders on the substrate. The openings in the transfer layer are disposed exactly on the placeholders of the substrate and provided to accommodate the graphene pieces. The openings exhibit the same pattern as the placeholders in the substrate and are thus disposed at the same distance with respect to one another as the placeholders on the substrate.

The transfer layer can additionally comprise further openings for fixation in the X-Y direction on the fixing pins of the chamber.

The transfer layer is preferably a thin flexible film, such as a polymer film, a film made of Kapton or of another material.

The transfer layer can be made of a plastic material, for example a polyimide, such as polysuccinimide, polybismaleimide, polybenzimidazole and polyoxadiazobenzimidazole, polyimide sulfone or polymethacrylimide.

The transfer layer has the function of a mediator for the graphene transfer onto the substrate and is therefore referred to as a transfer layer or mediator layer.

The transfer layer can, in particular, be made of hydrophobic material. This advantageously causes the film to have a repelling effect with respect to hydrophilic liquids, such as water. This advantageously causes the film to float on aqueous liquids upon contact therewith.

The transfer layer can preferably be made of a transparent or at least semi-transparent material. This advantageously allows the openings in the film to be matched, which is to say lined up exactly over the placeholders of the substrate.

The pattern of the placeholders on the substrate is transferred, true to scale, onto the transfer layer, for example by way of a printing method.

The transfer layer furthermore, preferably, includes opposing cut-outs by way of which it is fixed in the X-Y plane thereof, but not in the Z-plane thereof, at the fixing pins over the substrate.

For this purpose, the transfer layer has slightly larger dimensions than the substrate.

Step d):

In the next step, this transfer layer is disposed and aligned on the substrate holder over the substrate so that the openings of the transfer layer for the graphene pieces are exactly aligned over the placeholders on the substrate.

For this purpose, the openings in the transfer layer are lined up with the placeholders on the substrate. When the transfer layer is correctly disposed and aligned on the substrate, the openings of the transfer layer are located over the placeholders of the substrate.

Within the meaning according to the invention, the transfer layer thus represents a mask for the substrate. Due to the openings in the transfer layer, the placeholders of the substrate are not masked since the openings of the transfer layer are disposed directly over the placeholders. In contrast, the substrate is masked by the transfer layer outside the placeholders.

The masking, advantageously, causes the graphene pieces to be transferred, by way of the openings of the transfer layer, only to the intended locations of the substrate, which is to say to the placeholders in the chips, since the remaining locations of the substrate are masked.

This alignment of the transfer layer with the openings on the placeholders of the substrate is preferably not changed again in the X-Y plane during the method by the means for fixing the substrate and/or the transfer layer disposed in the device. In other words, the transfer layer is fixed on the substrate by the means for fixing, such as the fixing pins, such that the openings in the transfer layer are always seated over the placeholders. The means for disposing and aligning the transfer layer, these being the fixing pins, allow a fixation of the transfer layer in the X-Y plane, which is to say in the plane having the largest extension of the transfer layer, and prevent the rotation of the same about the center. In contrast, the transfer layer is freely movable in the Z-plane, since the diameter of the cut-outs by way of which the transfer layer is attached to the fixing pin, or fixing pins, is slightly larger than the diameter of the fixing pins.

This advantageously allows the transfer layer to be lifted off the substrate, without essentially losing the function as a mask, and without necessitating readjustment of the openings after the transfer layer has been lowered again. The transfer layer is thus movable in the Z-plane of the chamber, but not in the X-Y plane, or least only insignificantly, and can be raised and lowered perpendicularly to the substrate by liquid, without necessitating readjustment of the openings in the transfer layer over the placeholders of the substrate. The substrate remains fixed on the substrate holder.

In a top view on the transfer layer and the substrate, it is thus advantageously ensured, while carrying out the entire method, that the openings in the transfer layer are always disposed exactly above the placeholders on the substrate.

In a first approximation, the transfer layer preferably has a shape similar to the substrate since it is intended to mask the same. When a wafer serves as the substrate, for example, the transfer layer can likewise be substantially round.

Extending beyond the surface area of the substrate, the transfer layer, however, includes ear-shaped, semi-circular protuberances. These protuberances preferably include the aforementioned cut-outs in the center of the protuberances for fixation.

This measure advantageously allows the transfer layer to be attached to the fixing pins disposed in the chamber by way of the cut-outs. In particular, a cut-out extending through the film is accordingly disposed in each of the protuberances of the transfer layer. The cut-outs advantageously have a slightly larger diameter than the diameter of the fixing pins, so that it is possible to slip the cut-outs of the transfer layer over the fixing pins, and the transfer layer is fixed in the X-Y plane, but not in the Z-plane. The diameters of the cut-outs and of the fixing pins are to be harmonized with one another so that the transfer layer can be raised by admitting a liquid into the chamber, fixed at the fixing pins.

This measure, advantageously, also allows the transfer layer to be lifted off the substrate in the Z-plane of the chamber, and to be lowered again, by admitting and draining the liquid, and allows the openings for the graphene pieces in the transfer layer to be seated again exactly on the placeholders of the substrate. The transfer medium is the rising and/or falling liquid level on which the graphene pieces float.

Accordingly, the transfer layer is selected and designed so as to have an overlap with the protuberances thereof beyond the substrate, up to the fixing pin or fixing pins.

The transfer layer can be attached to the fixing pin or fixing pins, for example by clipping or placing the cut-outs over the fixing pins so as to fix the position of the openings over the placeholders of the substrate.

If more than one fixing pin is disposed in the chamber bottom, or around or on the substrate holder for the delimitation of the substrate, the transfer layer preferably has a surface area and protuberances for all these fixing pins. In addition to the openings for the graphene pieces, the transfer layer, for this purpose, comprises protuberances having cut-outs for the fixing pins so as to attach these to the fixing pins, for example, so as to guide the cut-outs over the fixing pins and, in this way, also prevent rotation of the floating transfer layer about the center thereof.

Preferably, the chamber for carrying out the method should comprise at least 2, better 3, 4, 5, or preferably 6 or even more fixing pins, which are disposed so as to delimit or surround the substrate holder. The length of the fixing pins is essentially predefined by the height of the chamber.

In a cross-sectional view of the chamber, in any case the upper edge of the fixing pins is disposed several centimeters above the surface of the substrate holder and the substrate located thereon. The fixing pins can also be disposed on the substrate holder itself, provided the substrate is selected to be smaller than the substrate holder, and the fixing pins approximately delimit the substrate at the outside edges thereof.

Advantageously, the substrate holder has a surface area that is approximately identical to that of the substrate. In one embodiment of the invention, the surface area of the substrate holder may be large enough that wafers common in the semiconductor industry can be positioned on the substrate holder.

The chamber, substrate holder, fixing pins and the like are preferably made of a plastic material, such as polymethyl methacrylate.

Preferably, the substrate holder is not rigidly connected to the chamber, but can be replaced, so that different substrate holders for different substrate sizes can be inserted in the chamber. For this purpose, the chamber can comprise an internal thread in the bottom for an external thread of a substrate holder.

The transfer layer includes a group of openings N_g having the size A, which are just large enough for the graphene pieces, where N=number, g=graphene and A=surface area. These openings are to be distinguished from the cut-outs for the fixing pins serving as means.

The transfer layer preferably includes marking and delimiting lines for the chips so as to carry out the alignment on the substrate in the desired manner. The lines, similarly to the chips, can form a checkerboard-like pattern on the substrate.

For example, if 15 graphene pieces are to be positioned on the placeholders on the substrate, the substrate comprises 15 placeholders for this purpose. The transfer layer accordingly likewise has at least 15 openings for these placeholders. It goes without saying that it is also possible to select a transfer layer that has more than 15 openings for the graphene pieces.

All openings in the transfer layer can be cut into this layer, for example by way of die cutting. The step of transferring the placeholders on the substrate in a manner true to scale, and in particular printing the placeholders onto the transfer layer in a manner true to scale, advantageously allows the openings of the transfer layer for the graphene to be aligned exactly over the placeholders of the substrate.

Step e):

Thereafter, a liquid is added to the chamber to above the transfer layer on the substrate, and the transfer layer is raised on the liquid column. Since the transfer layer, via the cut-outs in the protuberances, can be moved beyond the fixing pins only in the Z direction, the openings in the transfer layer also remain disposed exactly above the placeholders of the substrate. The transfer layer floats on the surface of the liquid.

When the end position in the Z-plane for the transfer layer has been reached, the supply of liquid is stopped. Thereafter, the graphene pieces are transferred into the openings N_g of the transfer layer. The transfer may take place manually, since the openings in the transfer layer are generally just large enough to accommodate one graphene piece. As viewed perpendicularly and from above onto the graphene pieces, these are then located directly above the placeholders in the substrate and are separated from these only by the liquid column.

In preparation, PMMA/graphene pieces are produced as follows, by way of example. A copper film on which graphene was grown by way of CVD and which has a surface area of A*N_g is spin-coated with a thin layer of >100 nm PMMA, for example. The polymer is applied to the graphene side. The polymer is then baked out for curing. By way of a scalpel or another sharp object, the PMMA layer is scored so as to produce N_g pieces having the surface area A. The PMMA/graphene/copper film is then placed in the copper etching solution with the copper first. After the copper has dissolved, the pieces are placed in deionized water for cleaning. It goes without saying that a different metal or plastic material can also be selected.

Step f):

The prepared PMMA/graphene pieces N_g are then transferred, for example individually, onto the surface of the liquid and into the openings of the transfer layer. For this purpose, the prepared PMMA/graphene pieces are transferred with the graphene side facing down, for example manually or by way of a suitable mechanical transport system, into the intended openings of the transfer layer. For example, advantageously an automatic robot system can also be employed, which detects, picks up and transfers the individual graphene pieces into the intended openings of the transfer layer.

Step g):

The distance between the substrate and the graphene pieces on the surface of the liquid is decreased until the graphene pieces are situated on the placeholders of the substrate.

Step g) is preferably employed by draining the liquid from the chamber. Alternatively, it is conceivable, as a second variant, to raise the substrate or the substrate holder to the surface of the liquid. For this purpose, a lifting mechanism is provided for the substrate holder.

In the first variant, the water is drained slowly. If there is not drain in the chamber, the water can be removed in any manner that does not change the positioning of the graphene pieces. In the simplest case, the liquid may also be removed from the chamber again by suctioning and draining the liquid.

Due to the decreasing liquid level, the transfer layer drops until the PMMA/graphene pieces make contact with the placeholders on the substrate.

The substrate is then preferably dried overnight, and the transfer layer is removed from the substrate.

This essentially completes the process.

The substrate may optionally be heated so as to improve the adhesion between the pieces and the substrate.

For further processing, the PMMA on the graphene pieces is removed, for example by way of acetone.

Additionally, masks for photolithography are preferably created on the substrate and used, which allow the graphene pieces to be further processed on the substrate. These masks are required subsequently to the method according to the invention so as to match the individual steps of the fabrication process to one another. For example, a first mask for the transfer layer must be matched to a second mask for structuring the graphene, to a third mask for metallizing, and optimally to further masks for all subsequent steps.

The method thus, in particular, represents a high throughput transfer technique and a large-scale transfer of graphene for electronic applications. The method can be readily used on a wafer scale to produce graphene-based components, such as G-FETs.

This advantageously upgrades the production rate of graphene-based components. The upgrade means, in particular, the fabrication of components on a scale of at least 4-inch wafers.

The graphene transfer according to this method can be carried out, for example, on $SiO_2$/Si wafers, $Al_2O_3$ wafers and flexible films, such as a polyimide film, serving as the substrate.

The method provides outstanding yields. The average yield is approximately 80%, which means that 80% of all graphene pieces were positioned in the correct location on the substrate. It can furthermore be derived from the results that the average yield of the method according to the invention is at least 80%. This is a very high value, in particular when assuming that, compared to the prior art, only approximately 5% of the graphene is required that would customarily be used for this wafer.

The method is thus very helpful in reducing the amount of wasted graphene. This simplifies the fabrication process and may constitute an intermediate step for the high-volume production of graphene components on an industrial scale.

In the broader sense, the method according to the invention furthermore represents a high throughput transfer technique and a large-scale transfer of 2-dimensional material onto a substrate. It is thus conceivable, within the scope of the invention, to dispose a material other than the aforementioned graphene pieces on a substrate using the method, and in particular to process this for electronic applications. This covers, in particular, CVD-grown 2-dimensional materials on semiconductor substrates.

BRIEF DESCRIPTION OF THE DRAWINGS

The invention will be described in more detail hereafter based on exemplary embodiments and the accompanying figures, without thereby limiting the invention.

In the drawings:

FIG. 4d shows reference axes for the device;

FIGS. 6a-6e are illustrations of the substrate with increasing enlargement of individual details from a) to e); FIG. 6a to FIG. 6e.

FIG. 1 shows that the method according to the prior art, as described in the introductory part of the description for the present patent application.

In FIG. 2, FIG. a) shows the substrate completely occupied with graphene, which has the disadvantage that this is not possible without creases, and further provides only a low yield, since a considerable proportion of the graphene pieces shown in dark has to be etched away again.

In FIG. 2, FIG. b) shows the approach according to the invention, where the substrate is occupied by a total of up to 52 graphene pieces. The dark spots 21, which are not denoted in greater detail, are the placeholders for the graphene pieces. In the present example, a wafer having a diameter of 10 cm is shown.

FIG. 3 shows the transfer layer 31. For the sake of clarity, only one respective member of multiple identical members in the transfer layer was denoted by reference numerals hereafter.

Figure 1A:
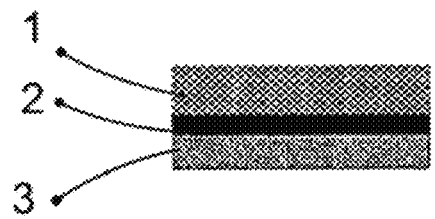
FIGS. 1a, 1b, 1c, and 1d show the prior art.
Figure 1B:
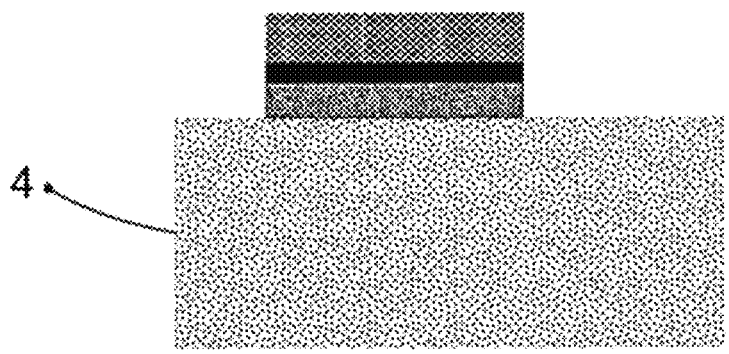
Figure 1C:
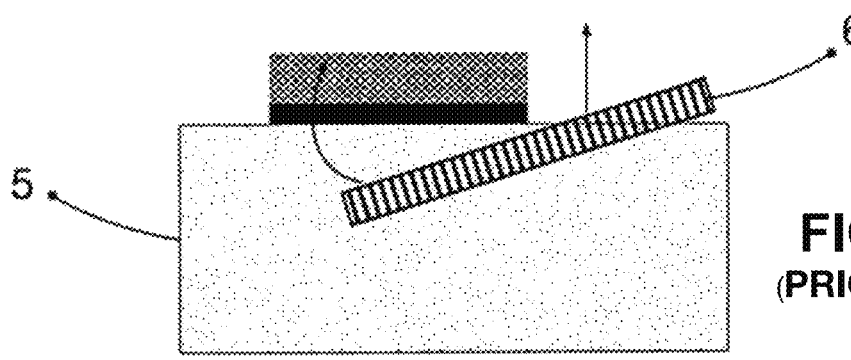
Figure 1D:

The transfer layer is made of Kapton and has a total of 44 openings 33 for the graphene pieces. In the present case, a transfer layer having a thickness of 0.1 mm was selected. The diameter 36 was 10 cm. At a diameter of 3 mm, each opening 33 for a graphene piece has a surface area of approximately 7 $mm^2$.

At the upper left and upper right edges, the transfer layer includes a respective protuberance 35, in the center of which a cut-out 32 is present. Due to the sectional view at the edges, another 4 of the total of 6 protuberances 35 that are present are not shown. Each protuberance 35 has a cut-out 32 at the center, which is large enough to comfortably guide it over the fixing pins 44 and to allow a movement of the transfer layer in the Z-direction of the chamber. The cut-outs 32 in the protuberances 35 have a diameter of approximately 5.25 mm for this purpose.

Moreover, the transfer layer includes further square markings 34 in the upper portion 6, into each of which a further opening could be cut. Additionally, there is room for two further openings in the lower left portion of the transfer layer, so that a total of 52 openings 33 could be introduced into the transfer layer, which correspond to the 52 placeholders on the 52 chips.

The transfer layer includes marking lines $L_S$ in a vertical arrangement, and $L_W$ in a horizontal arrangement, which form the same checkerboard-like pattern as the chips in FIG. 6 b).

The surface area delimited by the edge 36 of the transfer layer is approximately identical to the substrate. The remainder is an overlap for fixation at the fixing pins of the chamber.

FIG. 4 shows a device according to the invention for carrying out the method. FIG. 4 a) shows a top view, and FIG. 4 b) shows the sectional view corresponding to the top view.

FIG. 4 c) shows a detail from the base plate 46 in FIG. 4 b), the corresponding dimensional information being shown in mm, and FIG. 4 d) shows a Cartesian coordinate system, which is to be applied, in particular, to FIGS. 4 b) and c) and indicates how the movement of a transfer layer along the Z-plane of the chamber 40 takes place.

The chamber 40 is composed of a main body 41, which is loaded with deionized water 47 during the transfer according to the invention, a vacuum suction device 42, 43 serving as a substrate holder for the wafer, an input valve 43 for the vacuum supply, six alignment columns serving as fixing pins 44, and the intake and discharge valve 45 at the bottom of the body. Due to the sectional view, only 4 out of the 6 columns 44 are apparent in the bottom portion of the figure. In FIG. 4 a), only one of the fixing pins disposed in a circular manner around the substrate holder at the center is denoted by a reference numeral.

Figure 2A:
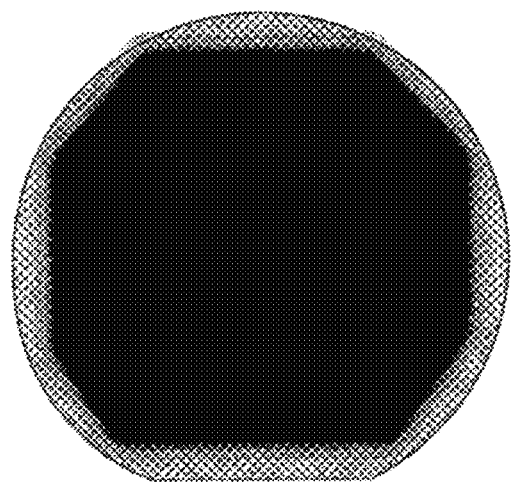
FIG. 2a shows a substrate comprising a large graphene piece according to the prior and FIG. 2b shows a substrate comprising 52 placeholders (dotted) for 52 small graphene pieces within the meaning of the invention.
Figure 2B:
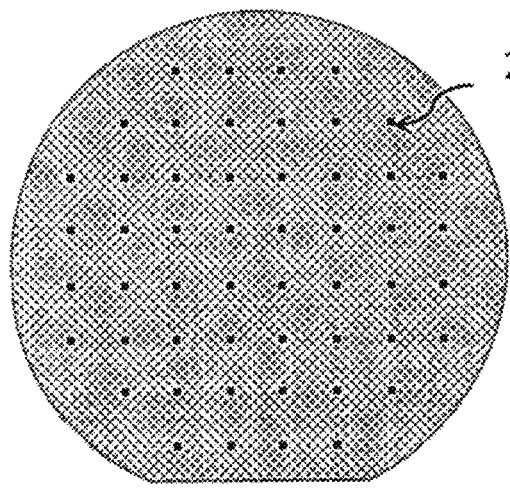
Figure 3:
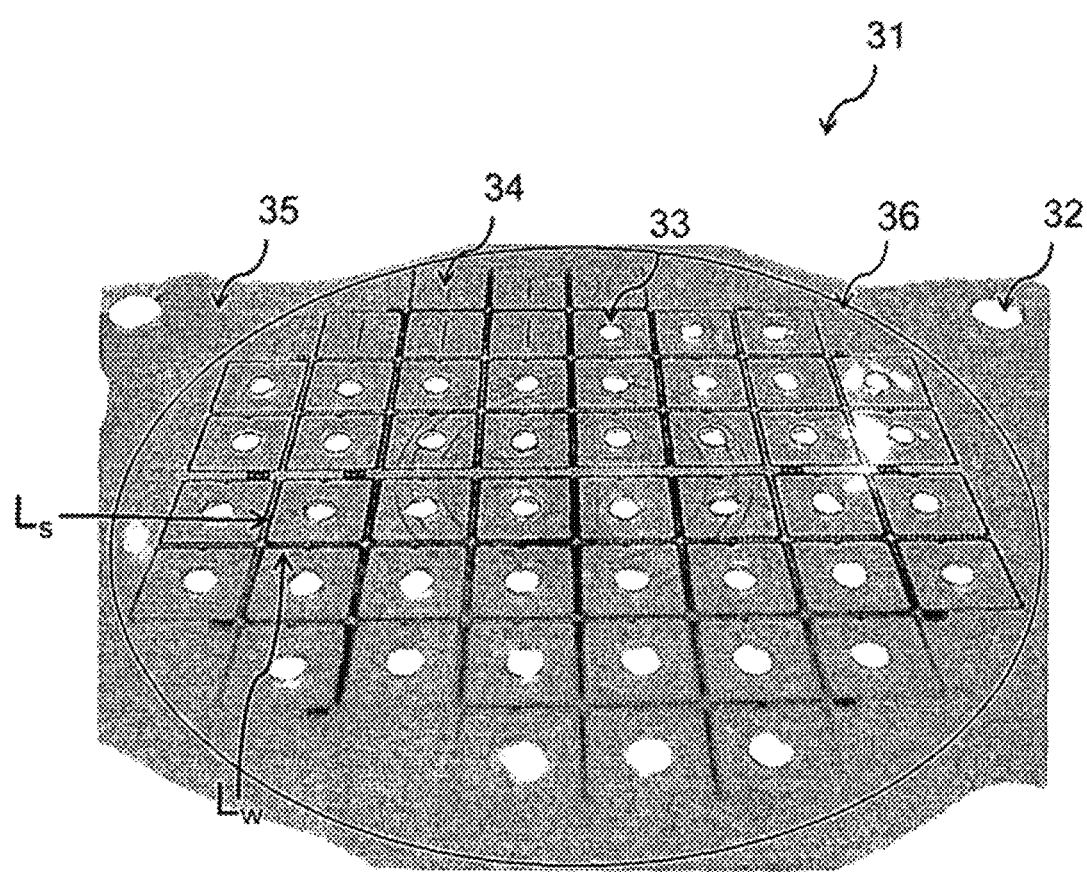
FIG. 3 shows a transfer layer 31 having a total of 44 openings 33 for accommodating the graphene pieces.
Figure 4A:
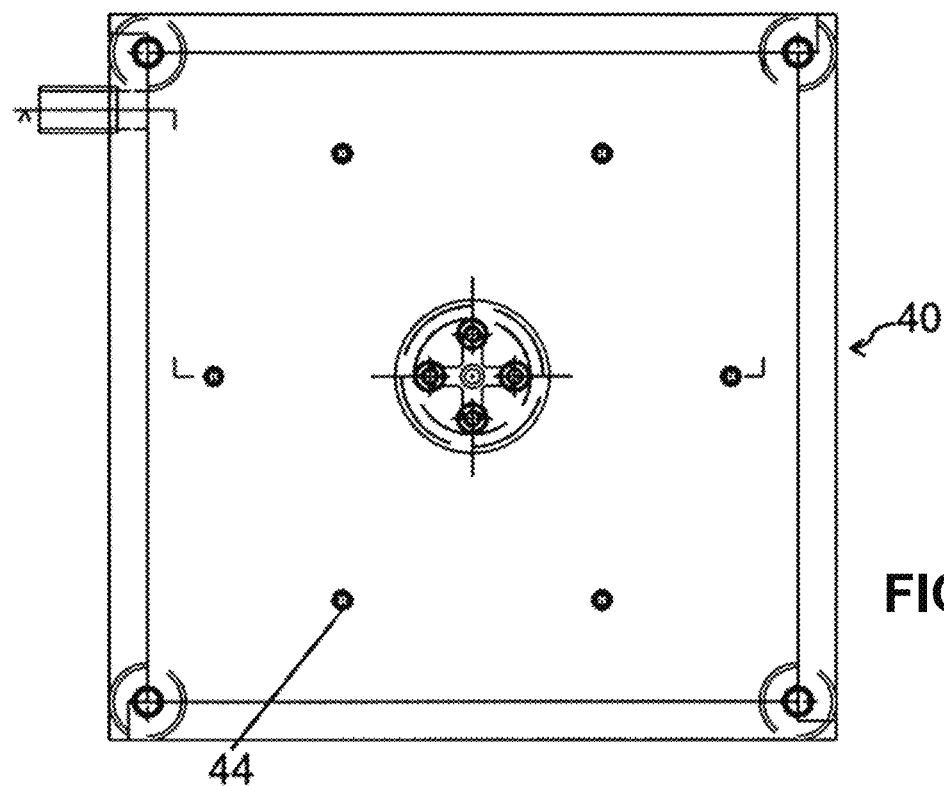
FIGS. 4a-4d shows a device 40 according to the invention for carrying out the method.
Figure 4B:
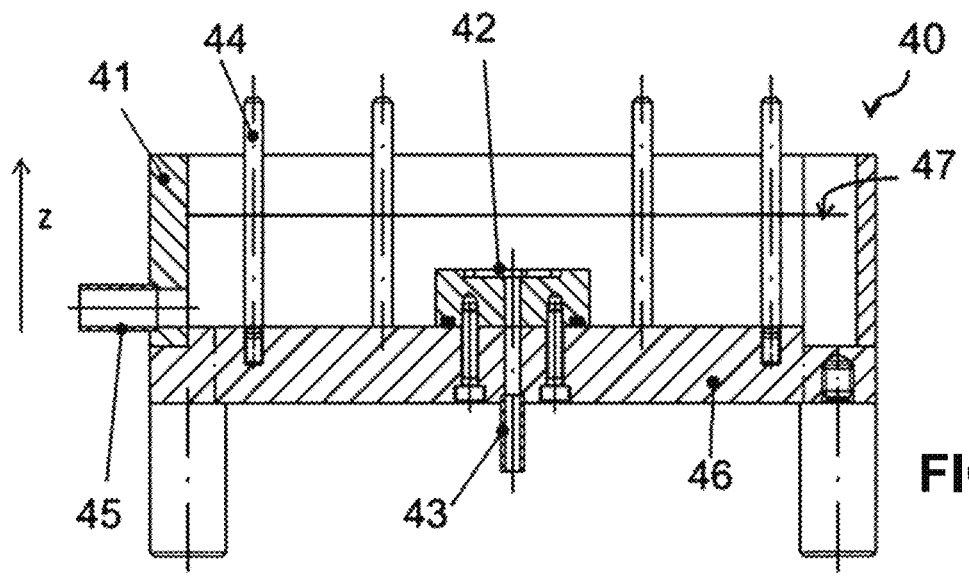
Figure 4C:
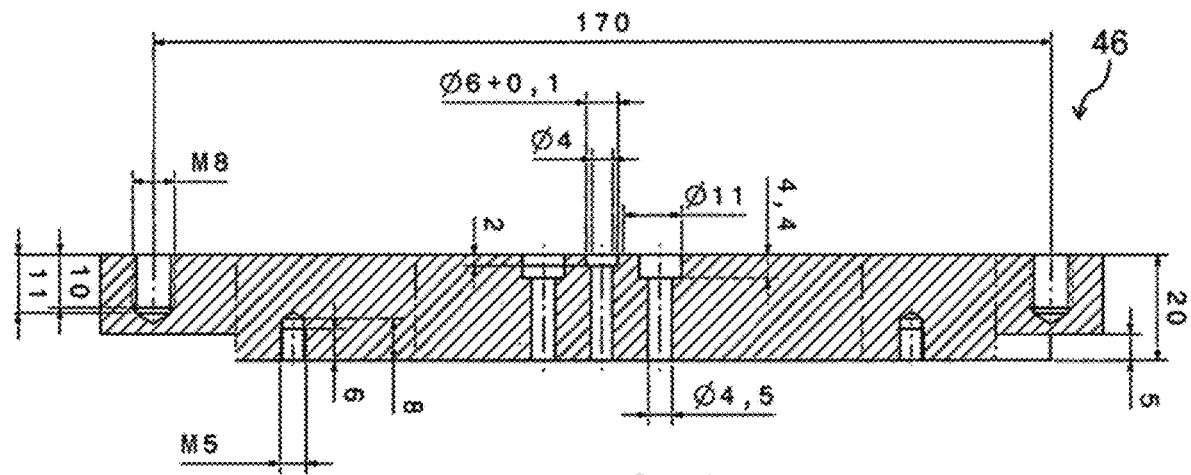
Figure 4D:
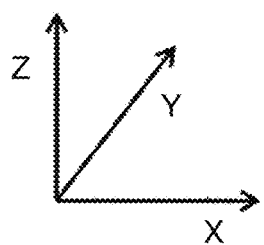

The wafer according to FIG. 2b, on which the placeholders have been prepared, is positioned on the substrate holder 42, which is to say the vacuum suction device. Thereupon, the transfer layer, together with the 6 cut-outs 32 thereof in the protuberances 35, is guided over the six alignment columns serving as fixing pins 44 and is fixed in the X-Y plane. Since the diameter of the fixing pins 44 is 5 mm, respectively, a diameter of 5.25 mm of the holes 32 in the transfer layer ensures that the transfer layer remains movable in the Z-direction of the chamber, but not in the X-Y plane of the transfer layer. Rotation of the transfer layer is thus precluded.

After the transfer layer has been roughly aligned with the checkerboard-like pattern, spanned by the lines $L_W$ and $L_S$, on the 52 chips and fixed in the X-Y direction, the substrate is aligned by rotating the substrate until the outside edges of each chip C are aligned exactly beneath the lines $L_W$ and $L_S$ of the transfer layer. This advantageously ensures that the openings 32 in the transfer layer are seated exactly centrally over the placeholders on the chips. Thereafter, the vacuum is switched on, and the substrate is fixed.

The fixing pins 44 or alignment columns can be anchored in the base plate 46, for example screwed thereto, as shown in the figure. However, without limiting the invention, they may also be disposed on the substrate holder 42. It thus goes without saying that the substrate holders and fixing pins provided in FIG. 4, and the arrangement thereof with respect to one another in the chamber, are provided only by way of example.

The transfer layer is prepared for the graphene with a true-to-scale placeholder pattern and the openings 33, each measuring 3 mm in diameter, and is manually matched to the substrate wafer such that the openings 33 are located exactly over the placeholders 21 of the substrate, on which the graphene is to be positioned on the wafer 20. The better this alignment according to steps c) and d) of the method takes place, the better and more reproducible the result of the transfer will be.

As soon as the deionized water 47 has been admitted via the intake valve 45, the transfer layer (not shown) begins to float on the water and is raised in the Z-direction of the chamber, as shown in FIG. 4, without being able to rotate.

The graphene to be transferred was CVD-grown on a 25 µm thick copper foil at 1000° C. for 30 minutes. For this purpose, 200 sccm argon, 50 sccm hydrogen and 0.5 sccm $CH_4$ were used as growth gases at a pressure of 12000 Pa. The Raman spectrum shows a monolayer of CVD graphene. Prior to the growth, the copper foils were thoroughly cleaned with HCl, followed by acetone and isopropanol.

PMMA (AR-P 669.04) was applied to the copper foil comprising the graphene by way of spin coating using 1000 rpm for 30 s. The PMMA was heated at 150° C. for 5 minutes so as to remove the solvent. The resulting layer thickness of the polymer ranges between 400 nm and 500 nm. Thereupon, the back of the film was exposed to oxygen plasma (50 W, 5 min, 200 sccm $O_2$) so as to eliminate the graphene traces present on the back of the film.

Figure 5:
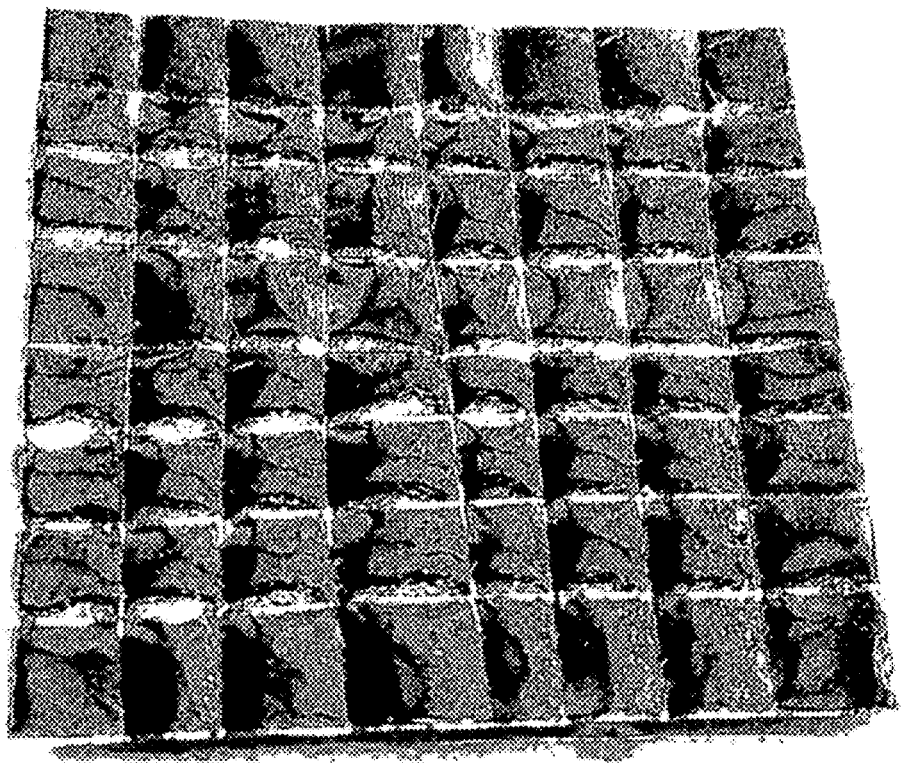
FIG. 5 shows a copper graphene film, which is lined, comprising a total of 64 still contiguous graphene pieces.

FIG. 5 shows such a film composed of three superimposed layers. A bottom layer is made of copper. Disposed thereon is CVD-grown graphene. Disposed thereon is PMMA. The film can be scored using a scalpel since this has a very fine tip. This prepared film is placed in the copper etching solution. The PMMA is used to be able receive the graphene pieces after the copper has been etched.

Prior to wet etching the copper, the PMMA/graphene/copper film is partially cut mechanically, using a scalpel. These cuts were made to cut through the PMMA/graphene layer, without damaging the copper foil beneath. After the copper foil was etched overnight in a 100 mM ammonium persulfate solution, a large number of small PMMA/graphene pieces were obtained, which float on the surface of the solution. The cuts using the scalpel facilitate the fabrication of pieces having such small dimensions. After the copper etching, the pieces were cleaned in a rinsing cascade using deionized water and transferred by way of the described method.

The PMMA/graphene pieces thus prepared have a size of approximately 2 by 2 mm² and thus just fit in the openings 33 of the transfer layer 31. The graphene pieces are then transferred, with the graphene facing down, into each of the openings 33 of the transfer layer 31 and float in the openings 33 on the water surface 47, according to steps e) to f) of the method.

By opening the discharge valve 45 in the chamber, the water level is lowered slowly until the transfer layer is seated on the wafer again. As a result of exactly matching the transfer layer 31 to the wafer, the graphene pieces are positioned exactly at the desired locations on the wafer, which is to say on the placeholders of the substrate.

After the water has been drained, the transfer layer, together with the PMMA/graphene pieces, is dried overnight. Lastly, the transfer layer is removed from the wafer, and the wafer, together with the PMMA/graphene pieces is treated as is known from the literature, for example as described in Liang, X., Sperling, B. a, Calizo, I., Cheng, G., Hacker, C. A., Zhang, Q., Richter, C. a. (2011). Toward clean and crackless transfer of graphene. ACS Nano, 5(11)(9144-53).

After the pieces have been transferred and dried, the wafer is heated at 160° C. for 15 minutes so as to improve the adhesion and further re-melt the PMMA. Lastly, the wafer is dipped in acetone for at least one hour so as to remove the PMMA, and is then baked out at 350° C. in an oxygen-free environment.

FIG. 6a schematically shows a wafer according to FIG. 2b comprising a total of 52 placeholders 21 on 52 chips, represented by the small black dots.

Each placeholder thus covers a surface area 21 in the chip, which approximately corresponds to the surface area of the graphene piece. Each wafer comprises a total of 52 chips including placeholders (FIG. 6b) onto which the graphene is to be transferred. Accordingly, 52 pieces of graphene are transferred precisely to these desired locations in the center of the chips.

Each of the 52 chips C in FIG. 6b) has the dimensions of approximately 11 by 11 mm². However, the size of the surface area in the center of the chips C, and thus the actual placeholder for which the graphene is intended, is only approximately 2 by 2 mm² (FIG. 6d)). This surface area is spanned by a plurality of metallizations 61, of which two are shown in FIG. 6e) and appear as light-colored lines 61. The placeholder according to FIG. 6d) is covered completely with graphene and thereafter is processed, for example by using further masks and by etching, so that the surface area indicated between the metallizations 61 is bridged by graphene 62. The two metallizations according to FIG. 6e) represent the source and drain, the graphene 62 represents a portion of the gate of the G-FET, and the bone-shaped depression perpendicularly between the metallizations represents a reservoir for an electrolyte. A plurality, this being a total of 32 here, of such FETs are provided on a placeholder and are accordingly covered with a piece of graphene, which is to be processed further, see FIG. 6d).

Figure 7:
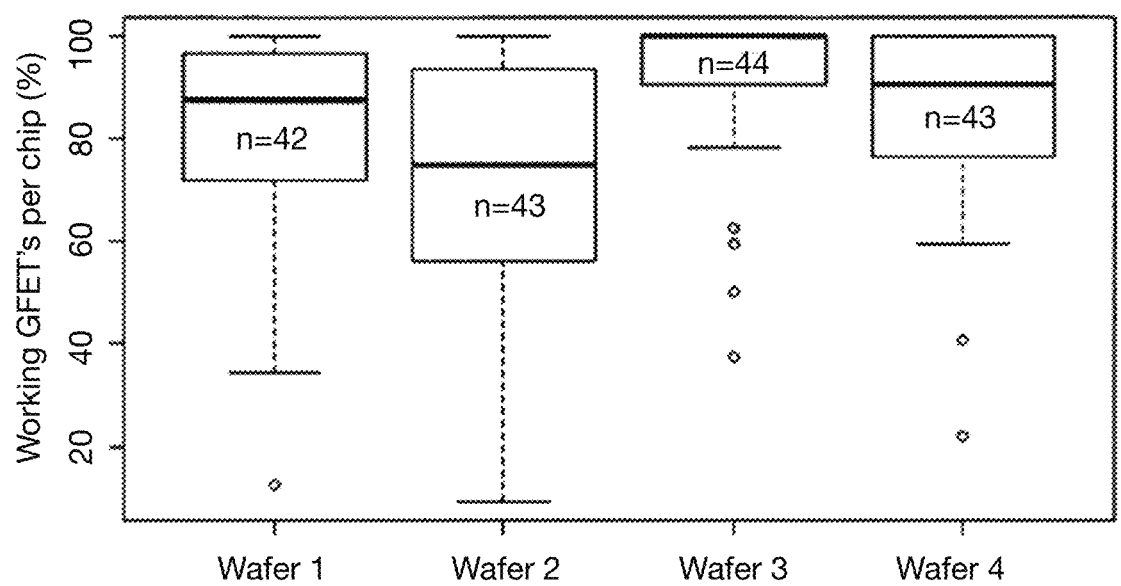
FIG. 7 shows the yield of the method according to the invention.

The described transfer was carried out for four silicon wafers. Images, which were produced with the aid of an optical microscope, were analyzed for each chip of each wafer for the transfer yield, which represents the ratio between the working components and the total number of components, which are graphene-based field effect transistors. The working components were determined by comparing the images to the mask pattern, wherein the scale was taken into consideration. The resulting statistics for these four wafers are shown in FIG. 7. The average value of the transfer yield is approximately 80%.

Options exist for modifying the exemplary embodiment, and for the method in general:

All solutions that etch copper, such as $Fe(NO_3)_3$, $FeCl_3$ or $(NH_4)_2S_2O_8$ are suitable copper etching solutions.

The solutions, however, do not attack the graphene and/or the PMMA. It would be conceivable to etch the copper by way of Aqua regina or a hydrochloric acid solution. However, these would also attack the graphene and the PMMA. The requirement with regard to the etching solution, which is met by the three listed examples, is thus to dissolve the copper, while not influencing the graphene and PMMA at all, or as little as possible.

Polymer films that can be used on the graphene include PDMS (polydimethylsiloxane), PMMA (polymethyl methacrylate), PC (poly(bisphenol A carbonate), polylactide (PLA), polyphthalamide (PPA) and so forth, wherein the mixtures thereof and multiple layers are also possible.

Any polymer film, which is preferably hydrophobic and/or transparent, may be used as the material for the transfer layer. Examples include Kapton, PET, polyester, polyethylene, polypropylene, polyvinyl chloride, polystyrene, polytetrafluoroethylene, and polymethyl methacrylate.

Instead of graphene on copper, the CVD technique also allows growth on other metal foils. These include nickel, iridium, ruthenium or copper nickel alloys. Each of these grown metal foils can be utilized as a graphene source for the transfer process, provided the etching solution is adapted accordingly.

Special treatments of the silicon surface are possible to ensure better adhesion of the graphene to the surface. For example, the use of APTES molecules increases the hydrophilicity of the surface, thereby simplifying the adhesion and the process.

The transfer layer may also be non-transparent, provided the matching of the openings over the placeholders of the substrate takes place in another manner. This may take place by exact matching of the substrate with the alignment columns or fixing pins 44. As a result, the use of a transparent transfer layer as a mediator film would no longer be necessary, but rather a non-transparent transfer layer would also be sufficient.

In the event that no silicon-based wafers are used as substrates, the transfer can be further simplified. Since the copper represents a source for impurities in silicon technology, it is not desirable to place a Si wafer in a copper etching solution. If, in contrast, aluminum oxide (sapphire) or a flexible substrate is used, the procedure can be simplified as follows:

The target substrate is placed in the center of the vacuum suction device serving as a substrate holder 42 for the substrate. The transfer layer is matched to the target substrate by way of the fixing pins, serving as alignment columns, and the openings are disposed over the placeholders.

The vacuum is applied so as to fix the substrate in the position thereof on the substrate holder.

The main chamber is loaded with the copper etching solution above the surface of the substrate, whereby the transfer layer floats on the copper etching solution surface over the substrate.

The N_g PMMA/graphene pieces are transferred individually, while still present on the copper foil, into the openings of the mediator film.

A waiting period follows until the copper foil has completely dissolved.

The etching solution is slowly drained by opening of the discharge valve and is replaced with deionized water for cleaning. Several water draining and replenishing steps follow to create a clean interface between the graphene and the desired substrate.

Finally, the water is completely drained, and the substrate, comprising the graphene pieces located thereon, is dried over-night.

It goes without saying that further modifications can be provided, depending on the substrate and the two-dimensional material to be transferred.

The invention claimed is:

1. A method for transferring a plurality of at least three graphene pieces onto a substrate, comprising:
    a) selecting a substrate comprising a plurality of at least three placeholders located on a first surface of the substrate, each placeholder of the plurality of at least three placeholders being a placeholder for a graphene piece from among the plurality of at least three graphene pieces, said each placeholder having an area less than a total area of said first surface;
    b) disposing the substrate on a substrate holder at a first height in a chamber;
    c) selecting a transfer layer having a plurality of openings;
    d) disposing the transfer layer in the chamber above the substrate;
    e) relatively aligning the substrate and transfer layer so that the openings in the transfer layer are aligned over the placeholders on the substrate;
    f) after said aligning, adding a liquid to the chamber, wherein the transfer layer floats in the liquid of the chamber so as to elevate relative to the substrate, the substrate remaining secure on the substrate holder at the first height in the chamber, and wherein a portion of the liquid occupies the plurality of openings of the transfer layer;
    g) after said adding, for each one graphene piece among the plurality of at least three graphene pieces, introducing said one graphene piece into a corresponding opening among the plurality of openings in the transfer layer; and
    h) reducing a distance between the substrate and the transfer layer until said each one graphene piece among the plurality of at least three graphene pieces is disposed on a corresponding placeholder among the plurality of at least three placeholders of the substrate; and
    wherein said each one graphene piece has an area no greater than an area of the corresponding placeholder on which said one graphene piece is disposed, said each one graphene piece remaining in said corresponding opening during said reducing;
    wherein the placeholders of the substrate and the openings of the transfer layer for the graphene pieces are aligned with respect to one another by way of a plurality of fixing pins.

2. The method of claim 1, wherein the transfer layer comprises cut-outs at the edge of the transfer layer which are guided into mating alignment with the fixing pins.

3. A device for carrying out a method for transferring a plurality of at least three graphene pieces onto a substrate, the method comprising:
    a) selecting a substrate comprising a plurality of at least three placeholders located on a first surface of the substrate, each placeholder of the plurality of at least three placeholders being a placeholder for a graphene piece from among the plurality of at least three graphene pieces, said each placeholder having an area less than a total area of said first surface;
b) disposing the substrate on a substrate holder at a first height in a chamber;
c) selecting a transfer layer having a plurality of openings;
d) disposing the transfer layer in the chamber above the substrate;
e) relatively aligning the substrate and transfer layer so that the openings in the transfer layer are aligned over the placeholders on the substrate;
f) after said aligning, adding a liquid to the chamber, wherein the transfer layer floats in the liquid of the chamber so as to elevate relative to the substrate, the substrate remaining secure on the substrate holder at the first height in the chamber, and wherein a portion of the liquid occupies the plurality of openings of the transfer layer;
g) after said adding, for each one graphene piece among the plurality of at least three graphene pieces, introducing said one graphene piece into a corresponding opening among the plurality of openings in the transfer layer; and
h) reducing a distance between the substrate and the transfer layer until said each one graphene piece among the plurality of at least three graphene pieces is disposed on a corresponding placeholder among the plurality of at least three placeholders of the substrate; and
wherein said each one graphene piece has an area no greater than an area of the corresponding placeholder on which said one graphene piece is disposed, said each one graphene piece remaining in said corresponding opening during said reducing; and
the device comprising:
a chamber, which can be loaded with liquid, and having therein a substrate holder for a substrate and a plurality of fixing pins for fixing orientation of the transfer layer in an X-Y plane defined by the transfer layer while permitting movement of the transfer layer along a Z-axis orthogonal to the X-Y plane; and
means for rotating the substrate within the X-Y plane to align the substrate and the transfer layer disposed above the substrate.

4. The device according to claim 3, further comprising an intake valve and/or discharge valve for the liquid.

5. The device according to claim 3, further comprising a lifting mechanism for raising the substrate holder along said Z-axis.

6. The device according to claim 3, further comprising a thin flexible film as the transfer layer.

7. A method for transferring a plurality of at least three graphene pieces onto a substrate, comprising:
a) selecting a substrate comprising a plurality of at least three placeholders located on a first surface of the substrate, each placeholder of the plurality of at least three placeholders being a placeholder for a graphene piece from among the plurality of at least three graphene pieces, said each placeholder having an area less than a total area of said first surface;
b) disposing the substrate on a substrate holder at a first height in a chamber;
c) selecting a transfer layer having a plurality of openings;
d) disposing the transfer layer in the chamber above the substrate;
e) relatively aligning the substrate and transfer layer so that the openings in the transfer layer are aligned over the placeholders on the substrate;
f) after said aligning, adding a liquid to the chamber, wherein the transfer layer floats in the liquid of the chamber so as to elevate relative to the substrate, the substrate remaining secure on the substrate holder at the first height in the chamber, and wherein a portion of the liquid occupies the plurality of openings of the transfer layer;
g) after said adding, for each one graphene piece among the plurality of at least three graphene pieces, introducing said one graphene piece into a corresponding opening among the plurality of openings in the transfer layer; and
h) reducing a distance between the substrate and the transfer layer until said each one graphene piece among the plurality of at least three graphene pieces is disposed on a corresponding placeholder among the plurality of at least three placeholders of the substrate; and
wherein said each one graphene piece has an area no greater than an area of the corresponding placeholder on which said one graphene piece is disposed, said each one graphene piece remaining in said corresponding opening during said reducing;
wherein the substrate is a wafer comprising a plurality of chip areas in a checkerboard-like pattern, each chip area among said chip areas having peripheral borders;
wherein the transfer layer has surface lines which extend in first and second directions; and
wherein said relatively aligning comprises rotating one of the transfer layer and substrate relative to the other of the transfer layer and substrate so that peripheral borders of said chip areas precisely align with the surface lines of the transfer layer.

8. A method for transferring a plurality of at least three graphene pieces onto a substrate, comprising:
a) selecting a substrate comprising a plurality of at least three placeholders located on a first surface of the substrate, each placeholder of the plurality of at least three placeholders being a placeholder for a graphene piece from among the plurality of at least three graphene pieces, said each placeholder having an area less than a total area of said first surface;
b) disposing the substrate on a substrate holder at a first height in a chamber;
c) selecting a transfer layer having a plurality of openings;
d) disposing the transfer layer in the chamber above the substrate;
e) relatively aligning the substrate and transfer layer so that the openings in the transfer layer are aligned over the placeholders on the substrate;
f) after said aligning, adding a liquid to the chamber, wherein the transfer layer floats in the liquid of the chamber so as to elevate relative to the substrate, the substrate remaining secure on the substrate holder at the first height in the chamber, and wherein a portion of the liquid occupies the plurality of openings of the transfer layer;
g) after said adding, for each one graphene piece among the plurality of at least three graphene pieces, introducing said one graphene piece into a corresponding opening among the plurality of openings in the transfer layer; and
h) reducing a distance between the substrate and the transfer layer until said each one graphene piece among the plurality of at least three graphene pieces is disposed on a corresponding placeholder among the plurality of at least three placeholders of the substrate; and wherein said each one graphene piece has an area no greater than an area of the corresponding placeholder on which said one graphene piece is disposed, said each one graphene piece remaining in said corresponding opening during said reducing;

wherein the chamber includes a plurality of fixing pins and the transfer layer includes a corresponding plurality of cutouts in mating alignment with the fixing pins during steps d) to h);

wherein the plurality of fixing pins fix the transfer layer during steps d) to h) in an X-Y plane defined by the transfer layer so as to restrict movement of the transfer layer to along an orthogonal Z-axis; and wherein in step h), as the liquid is removed from the chamber, the transfer layer is lowered along the Z-axis guided by the fixing pins so that the graphene pieces in the openings of the transfer layer are transferred onto the placeholders of the substrate.

* * * * *